United States Patent [19]
Naiki

[11] Patent Number: 5,446,699
[45] Date of Patent: Aug. 29, 1995

[54] BIT-LINE PAIR SELECTING CIRCUIT IN A MEMORY CELL ARRAY

[75] Inventor: Ihachi Naiki, Kanagawa, Japan

[73] Assignee: Sony Corporation, Tokyo, Japan

[21] Appl. No.: 225,520

[22] Filed: Apr. 11, 1994

Related U.S. Application Data

[62] Division of Ser. No. 975,085, Nov. 12, 1992.

[30] Foreign Application Priority Data

Nov. 12, 1991 [JP] Japan ................... 3-323795
Feb. 4, 1992 [JP] Japan ................... 4-047884

[51] Int. Cl.[6] ................................ G11C 8/00
[52] U.S. Cl. .............. 365/230.04; 365/154; 365/189.02
[58] Field of Search ........ 365/189.08, 230.06, 365/154, 189.01, 230.04, 189.12

Primary Examiner—Joseph A. Popek
Assistant Examiner—F. Niranjan
Attorney, Agent, or Firm—Hill, Steadman & Simpson

[57] ABSTRACT

An SRAM cell comprising a flip-flop consisting of first and second inverters, and two word transistors connected to the flip-flop. In this cell, the gates of the word transistors are composed of a single word line, and the gate of a driver transistor in the first inverter is provided on one side of the word line, while the gate of a driver transistor in the second inverter is provided on the other side of the word line. The gate regions of the driver transistors in the first and second inverters are so formed as to partially overlap the bit-line side diffused layer regions of the word transistors. Also disclosed is a memory cell array comprising a plurality of cell rows each having a plurality of the above SRAM cells. In this array, the memory cells disposed in the even row are so arranged as to have a positional deviation of approximately half the cell length in the same direction respectively from the memory cells disposed in the odd row.

3 Claims, 11 Drawing Sheets

BIT-LINE PAIR SELECTING CIRCUIT IN A MEMORY CELL ARRAY

This is a division, of application Ser. No. 07/975,085, filed Nov. 12, 1992, now abandoned.

BACKGROUND OF TEE INVENTION

1. Field of the Invention

The present invention relates to a memory cell of a static RAM and an array of such memory cells.

2. Description of the Prior Art

In a static RAM (hereinafter referred to as SRAM) having a storage capacity of 256 kilobits to 4 megabits, it has been customary heretofore that two driver transistors are disposed on one side of each word line constituting a word transistor.

However, in any SRAM of a storage capacity exceeding 16 megabits, memory cells each using a thin film transistor (TFT) as a load are principally employed, and therefore it is necessary to form an adequate pattern adapted for such a structure.

Figure 1:
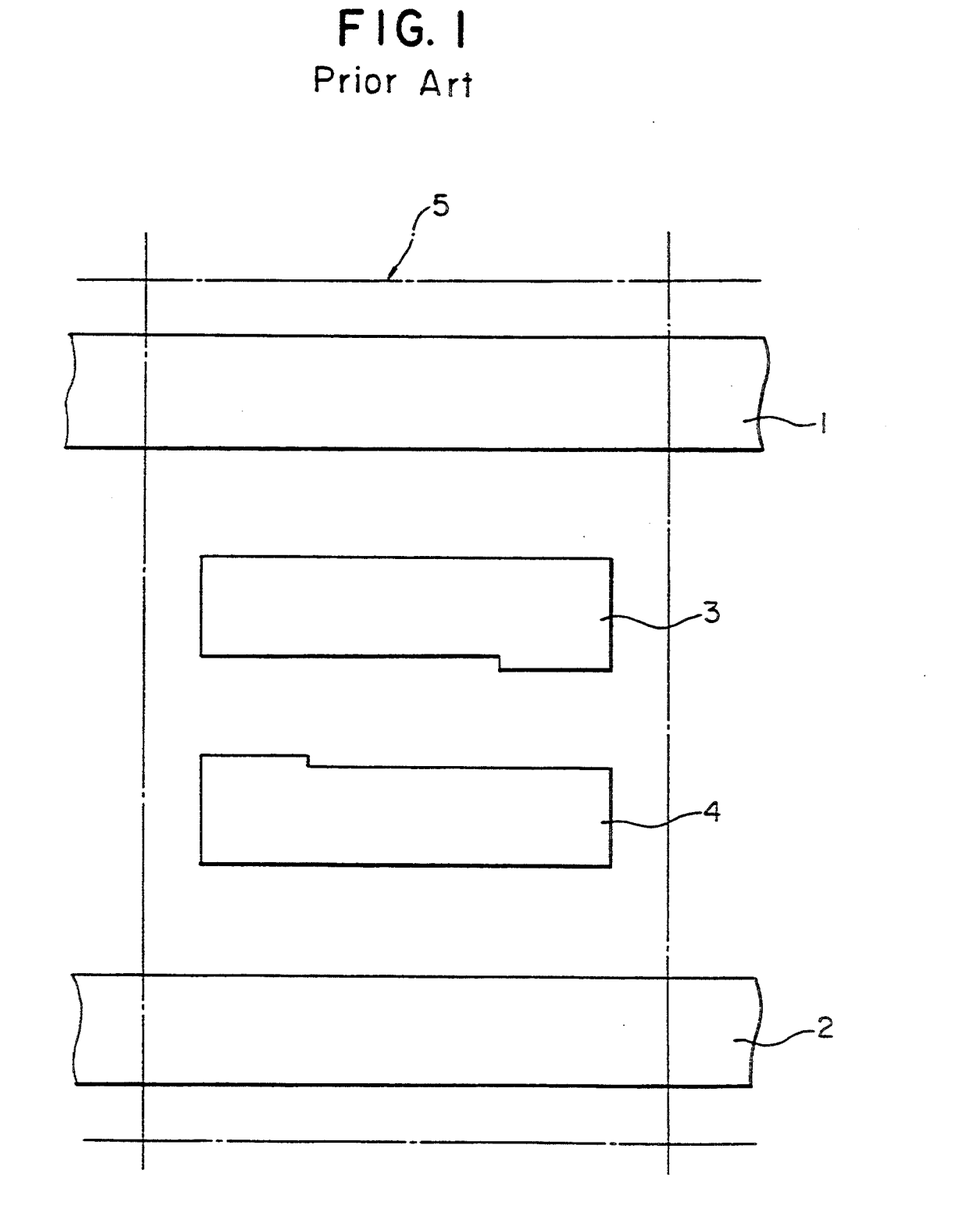
FIG. 1 is a layout diagram showing a pattern of word lines and gate wiring layers of driver transistors in a first conventional example of an SRAM cell.

For achieving the above requirement, there is proposed an SRAM cell of an exemplary pattern illustrated in FIG. 1.

This diagram merely shows word lines 1, 2 composed of a first-layer polycrystal silicon film, and gates 3, 4 of driver transistors out of entire component parts constituting an SRAM cell 5.

The two word lines 1, 2 are disposed in parallel with each other for one memory cell 5, and the gates 3, 4 of driver transistors are disposed between the two word lines 1, 2 in parallel thereto.

In the SRAM cell of such constitution, there exists a drawback that the area of the cell is relatively large due to the presence of two word lines disposed in each cell.

Figure 2:
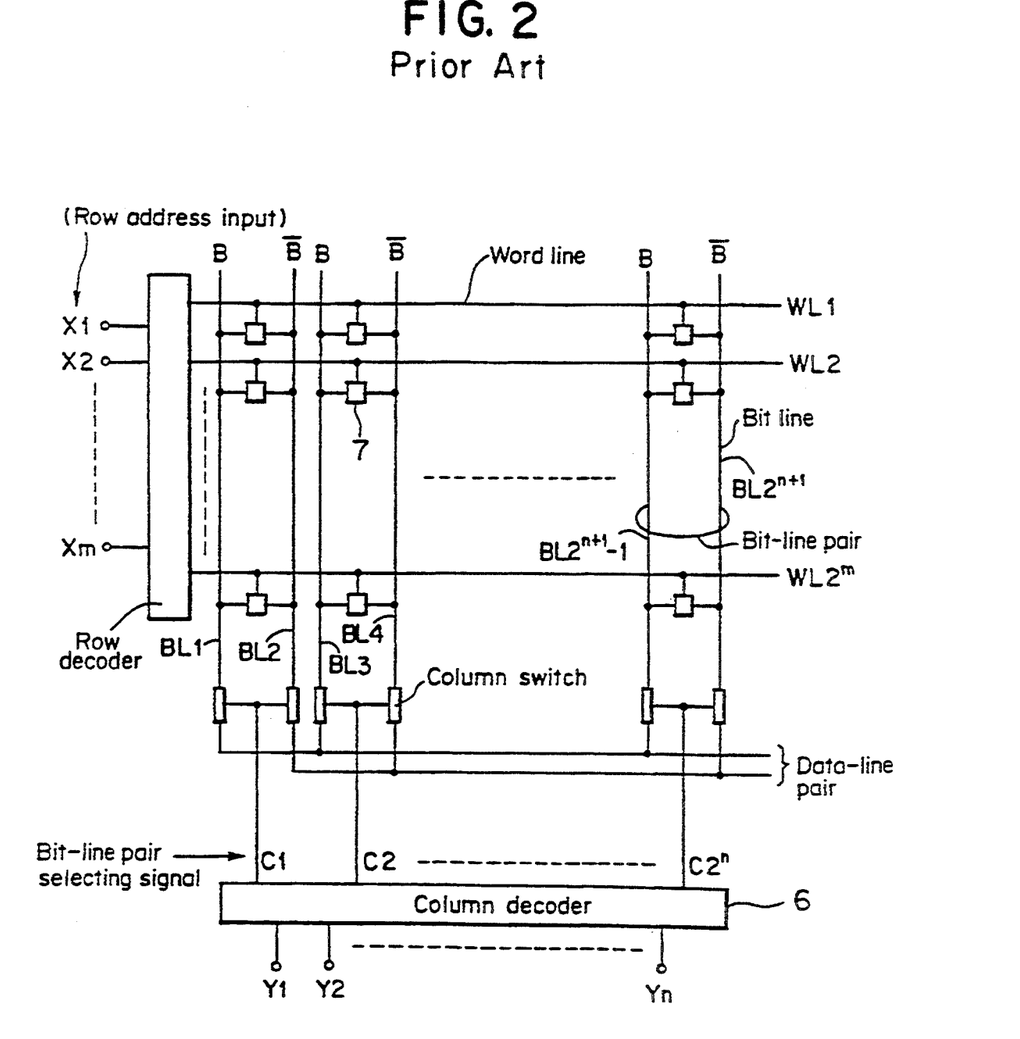
FIG. 2 is a block diagram of a bit-line pair selecting circuit in a second conventional example of an SRAM cell array.

Furthermore, in an SRAM of a storage capacity ranging from 256 kilobits to 4 megabits, two driver transistors are disposed on one side of a single word line constituting a word transistor. Meanwhile in an SRAM of a storage capacity exceeding 16 megabits, there are principally employed memory cells each using a thin film transistor as a load, so that an adequate pattern adapted for such a structure becomes necessary. In one conventional SRAM cell array, as shown in FIG. 2, memory cells 7 are arranged horizontally and vertically in a manner to respectively have a positional deviation corresponding to the length of one cell, and each column of the memory cells 7 arrayed in parallel with bit lines has one bit-line pair.

OBJECTS AND SUMMARY OF THE INVENTION

It is a first object of the present invention to provide an improved SRAM cell having a reduced area, and an array of such memory cells.

And a second object of the present invention resides in providing a bit-line pair selecting circuit which is capable of performing proper selection of each bit-line pair in an SRAM cell array where each bit line functions as one of the paired bit lines for the memory cells in an odd row and also as one of the paired bit lines for the memory cells in an even row.

According to one aspect of the present invention, there is provided an SRAM cell comprising a flip-flop consisting of a first inverter and a second inverter, and two word transistors connected to such flip-flop. In this memory cell, the gates of the word transistors are composed of a single word line, and the gate of a driver transistor in the first inverter is positioned on one side of the word line, while the gate of a driver transistor in the second inverter is positioned on the other side of the word line.

According to another aspect of the present invention, there is provided a memory cell array comprising a plurality of cell rows each having a plurality of the memory cells mentioned above. In this array, the memory cells disposed in the even row are so arranged as to respectively have a positional deviation of approximately half the cell length in the same direction from the memory cells disposed in the odd row.

According to a further aspect of the present invention, there is provided a bit-line pair selecting circuit in a memory cell array where SRAM cells in odd rows and those in even rows are so arranged as to respectively have a positional deviation of approximately half the cell length parallel with word lines and, with the exception of the bit lines at both ends of the array, each bit line functions as one of the paired bit lines for the odd-row memory cells and also as one of the paired bit lines for the even-row memory cells. This selecting circuit comprises individual column switches connected respectively to the bit lines at both ends; parallel-connected column switch pairs connected respectively to the bit lines except those at both ends; a column decoder for outputting bit-line pair selecting signals in accordance with input column address signals; and an AND gate circuit group for outputting logical products of the bit-line pair selecting signals, a low-address LSB signal and an inverted signal thereof. In this configuration, the switching actions of the individual column switches and the mates of the column switch pairs are controlled by the output signals of the AND gate circuit group.

The above and other features and advantages of the present invention will become apparent from the following description which will be given with reference to the illustrative accompanying drawings.

DESCRIPTION OF THE PREFERRED EMBODIMENTS

Figure 3:
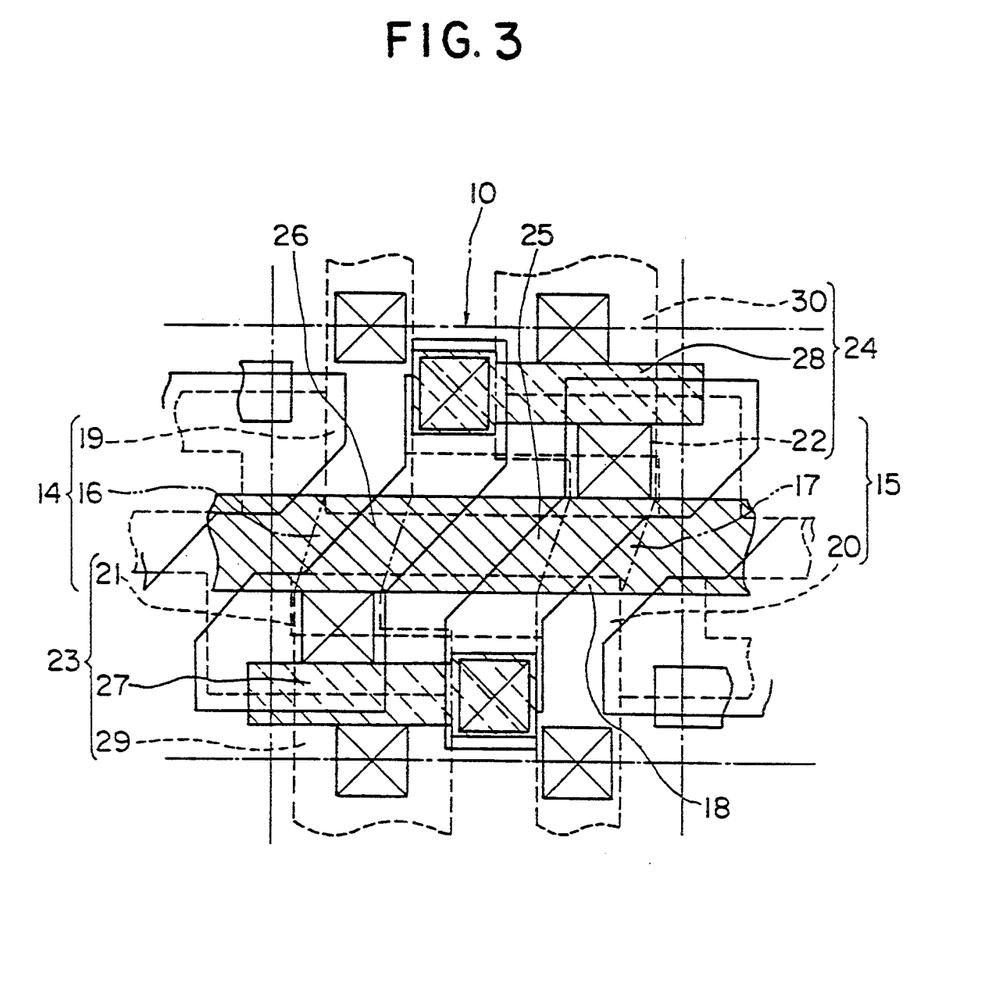
FIG. 3 is a layout diagram showing a gate pattern in a first embodiment of an SRAM cell according to the present invention.
Figure 4:
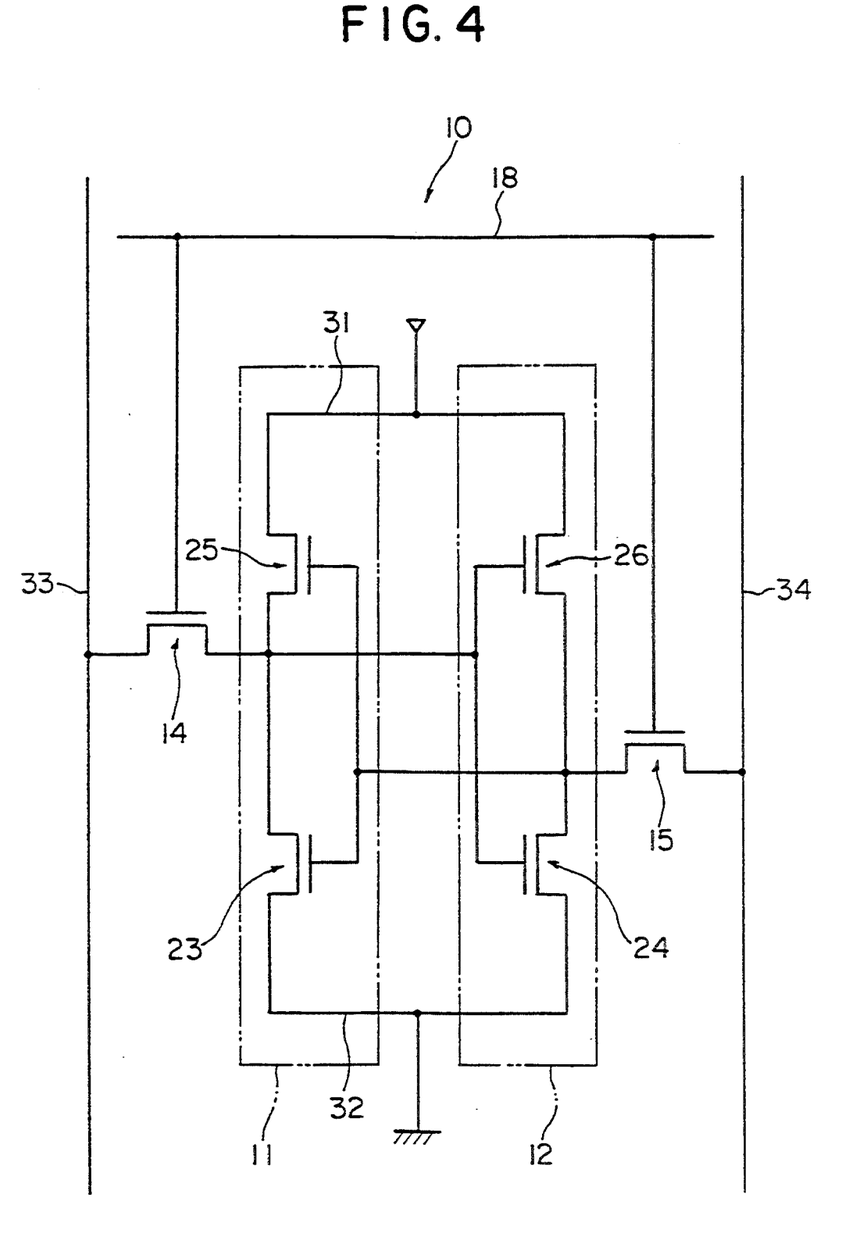
FIG. 4 shows the circuit configuration of the first embodiment in FIG. 3.

Hereinafter a first embodiment of the present invention will be described with reference to a layout diagram of FIG. 3 and a circuit configuration diagram of FIG. 4.

As shown, an SRAM cell 10 comprises a flip-flop (not shown in FIG. 3) consisting of a first inverter 11 and a second inverter 12 (not shown in FIG. 3) of which input and output terminals are mutually cross-connected at intersections thereof, and two word transistors 14, 15.

Gates 16, 17 of such word transistors 14, 15 are composed of a single word line 18 (denoted by oblique solid lines).

A bit-line side diffused layer region 19 is formed on one side of the gate 16, while a storage-node side region 21 is formed on the other side thereof. Similarly, a bit-line side diffused layer region 20 is formed on one side of the gate 17, while a storage-node side region 22 is formed on the other side thereof.

In the first inverter 11, a driver transistor 23 and a load element 25 are connected in series to each other. Similarly in the second inverter 12, a driver transistor 24 and a load element 26 are connected in series to each other. Each of the driver transistors 23, 24 is composed of, e.g., a MOS transistor. And each of the load elements 25, 26 is composed of, e.g., a MOS thin film transistor.

A gate 27 (denoted by oblique broken lines) of the driver transistor 23 is provided on one side of the word line 18, while a gate 28 (denoted by oblique broken lines) of the driver transistor 24 is provided on the other side thereof.

A drain region of the driver transistor 23 is used in common with the storage-node side region 21 of the word transistor 14, and a drain region of the driver transistor 24 is used in common with the storage-node side region 22 of the word transistor 15.

A source region 29 of the driver transistor 23 is provided on the reverse side of the storage-node side region 21 (drain region of the driver transistor 23) with respect to the gate 27, and a source region 30 of the driver transistor 24 is provided on the reverse side of the storage-node side region 22 (drain region of the driver transistor 24) with respect to the gate 28.

A power supply line 31 is connected to each of the load elements 25, 26, and a ground line 32 (not shown in FIG. 3) is connected to each of the source regions 29, 30 of the driver transistors 23, 24. Further a first bit line 33 (not shown in FIG. 3) is connected to the bit-line side diffused layer region 19, while a second bit line 34 (not shown in FIG. 3) is connected to the bit-line side diffused layer region 20.

In the SRAM cell 10 (hereinafter referred to as memory cell 10) of the structure mentioned above, the word lines can be numerically decreased by one in comparison with those in the conventional memory cell due to the provision of the gates 27, 28 of the driver transistors 23, 24 on both sides of the word line 18, whereby it is rendered possible to reduce the area of the memory cell 10 correspondingly to one word line.

In the memory cell 10 where the respective gates 27, 28 of the driver transistors 23, 24 are disposed substantially in parallel with the word line 18, a desired pattern can be formed by the Lebenson phase shifting method or the like.

Figure 5:
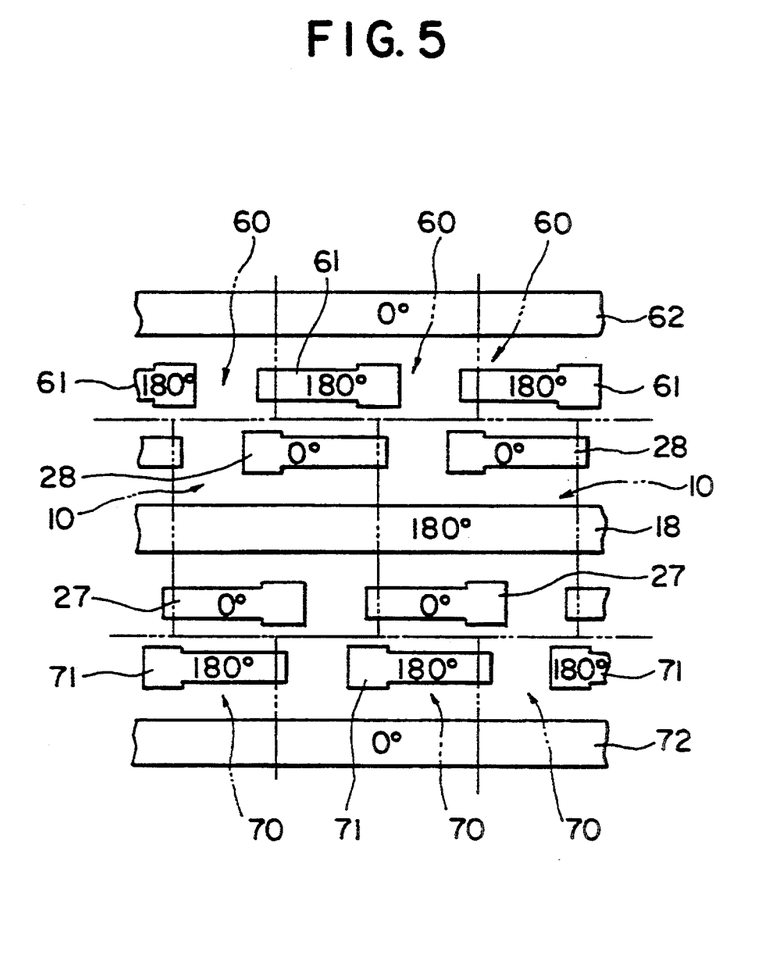
FIG. 5 is a layout diagram of a gate pattern in the first embodiment of FIG. 3 representing the SRAM cell of the invention.

More specifically, as shown in a gate pattern layout diagram of FIG. 5, the phase of the word line 18 in the memory cell 10 is set to 180° and the phases of the gates 27, 28 of the driver transistors are set to 0°. In this example, the phases of the gates 61, 71 of the driver transistors in the other memory cells 60, 70 adjacent in parallel to the gates 27, 28 of the driver transistors are set to 180°, and the phases of the word lines 62, 72 of the memory cells 60, 70 are set to 0°. In this manner, the phases in the pattern are set to 0°, 180°, 0°, 180° and so forth with a difference of 180° per column.

Next a second embodiment of the present invention will be described below with reference to a layout diagram of FIG. 6 and a sectional view of FIG. 7 taken along the line A—A in FIG. 6.

In these diagrams, the same component parts as those employed in the aforementioned first embodiment are denoted by the same reference numerals.

Figure 6:
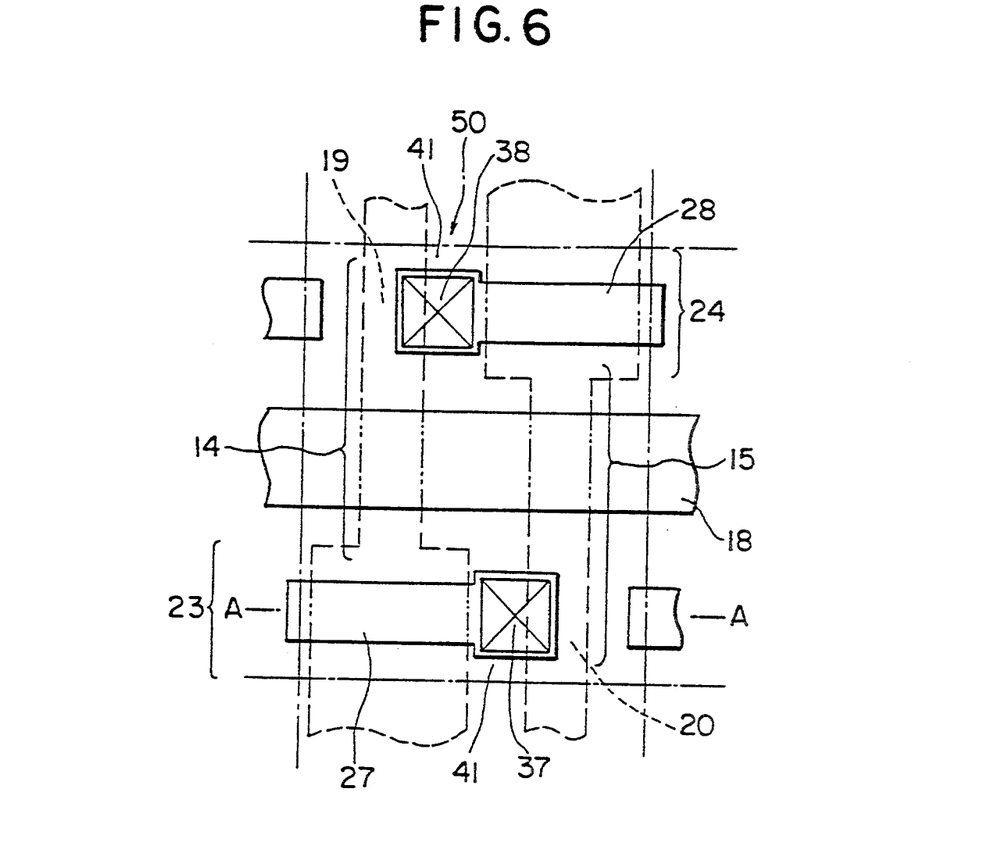
FIG. 6 is a layout diagram of a second embodiment representing the SRAM cell of the present invention.
Figure 7:
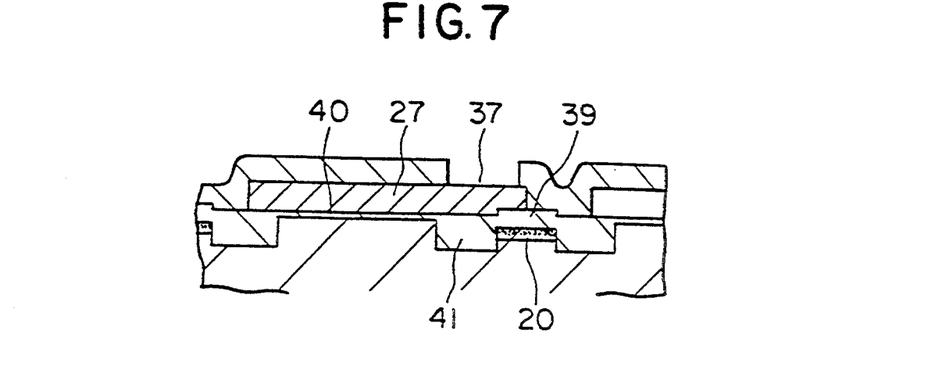
FIG. 7 is a sectional view taken along the line A-A in the second embodiment of FIG. 6 representing the SRAM cell of the invention.

An SRAM cell 50 shown in FIGS. 6 and 7 is so constituted that a contact 37 between a portion of the gate 27 of the driver transistor 23 and an unshown load element in the SRAM cell 10 (FIG. 3) of the first embodiment is disposed to overlap the bit-line side diffused layer region 20 of the word transistor 15, and similarly a contact 38 between a portion of the gate 28 of the driver transistor 24 and another unshown load element is disposed to overlap the bit-line side diffused layer region 19 of the word transistor 14.

Figure 8:
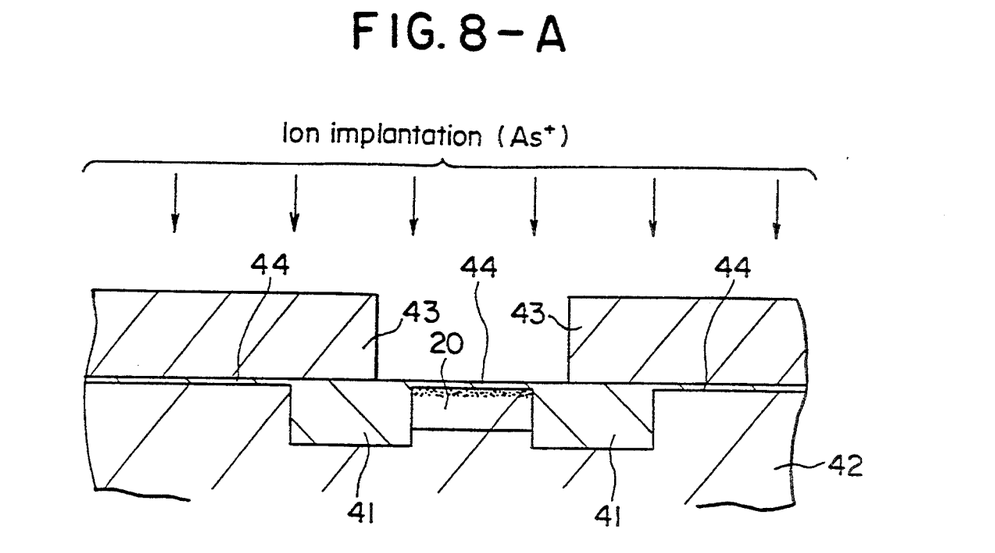
FIGS. 8A through 8C illustrate process steps in manufacture of the gate insulating film and the gates shown in FIG. 7.

A gate insulating film 39 between the contact 37 and the bit-line side diffused layer region 20, and a similar gate insulating layer (not shown) between the composed of monocrystal silicon, and thereafter, as shown in FIG. 8A an ion implanting mask 43 is formed of a resist by the known photolithography on the semiconductor substrate 42. In this step, an oxide film 44 is previously formed on the semiconductor substrate 42. And then ions of arsenic (As+) are implanted into an upper layer of the bit-line side diffused layer region 20 (19 in FIG. 6).

Subsequently, as illustrated in FIG. 8B, the oxide film 44 is removed, and a gate insulating film 40 is formed by thermal oxidation on the upper layer of the semiconductor substrate 42. In this step, an N+diffused layer 45 is formed in the upper portion of the arsenic ion-implanted region, so that the upper portion of the N+diffused layer 45 is oxidized faster than the upper layer of the semiconductor substrate 42. Consequently the gate insulating film 40 formed on the N+diffused layer 45 is rendered thicker than the gate insulating film 40 formed on the semiconductor substrate 42.

Thereafter as illustrated in FIG. 8C, a polycrystal silicon film is formed by, e.g., chemical vapor deposition on the entire surface of the gate insulating film 40, and a gate 27 (28 in FIG. 6) is formed by the known photolithography and etching. In this step, a word line 18 (FIG. 6) is also formed simultaneously therewith.

Consequently, there is ensured the required insulation between the gate 27 (28) and the bit-line side diffused layer region 20 (19).

Hereinafter a third embodiment of the present invention will be described with reference to a schematic layout wiring diagram of FIG. 9 which shows a memory cell array comprising a plurality of the memory cells 10 in the first embodiment (or the memory cells 50 in the second embodiment).

This diagram represents an exemplary constitution which consists of four rows each comprising three memory cells 10.

Figure 9:
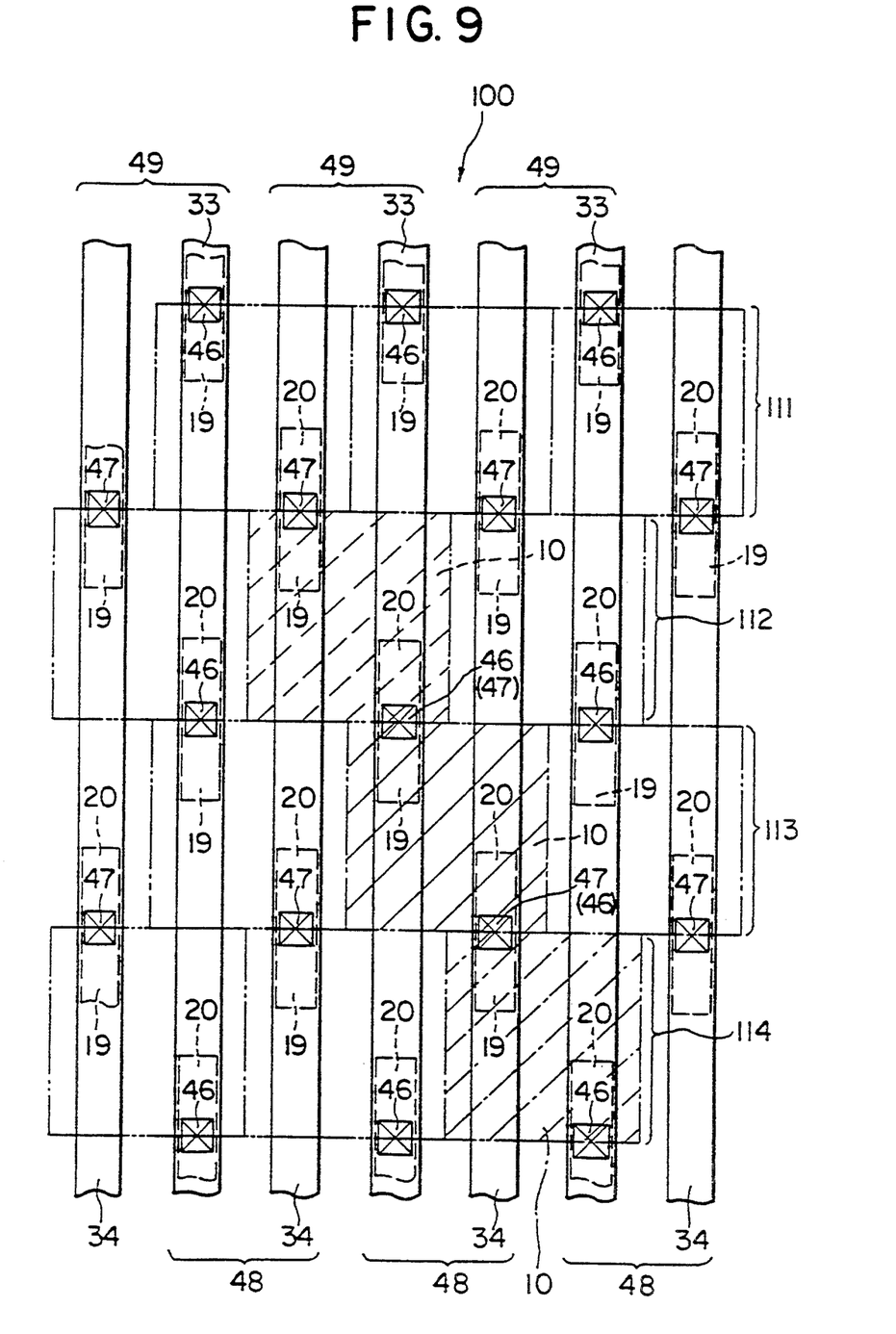
FIG. 9 is a schematic layout wiring diagram of a third embodiment representing the SRAM cell of the invention.

As shown in FIG. 9, a memory cell array 100 consists of four cell rows 111, 112, 113, 114, wherein the memory cells 10 in the even rows 112 and 114 have a positional deviation of approximately half the cell length in the same direction respectively from the memory cells 10 in the odd rows 111 and 113.

In any case where there are provided a plurality of rows each consisting of a plurality of memory cells 10, similarly to the above, the memory cells 10 in the even rows are disposed with a positional deviation of approximately half the cell length respectively from the memory cells 10 in the odd rows.

Taking notice now of one memory cell 10 (denoted by oblique solid lines) in the third row 113 from the top, one bit contact 46 of this memory cell 10 is used in common with one bit contact 47 of the memory cell 10 in the second row 112 (denoted by oblique broken lines) adjacent to the relevant memory cell 10. Meanwhile the other bit contact 47 of the relevant memory cell 10 denoted by oblique solid lines is used in common with one bit contact 46 of the memory cell 10 (denoted by oblique one-dot chained lines) in the fourth row 114 adjacent to the relevant memory cell 10.

Out of the memory cells 10 disposed in the rows 111 and 113, the bit contacts 46 of the memory cells 10 in the same column are mutually connected via a first bit line 33. And out of the memory cells 10 disposed in the rows 112 and 114, the bit contacts 47 of the memory cells 10 in the same column are mutually connected via a second bit line 34.

Accordingly, out of the memory cells 10 in the odd rows, the bit contacts 46, 47 of the memory cells 10 in the same columns are mutually connected via a bit line pair 48 (bit lines 33 and 34). Similarly, out of the memory cells 10 in the even rows, the bit contacts 47, 46 of the memory cells in the same columns are mutually connected via a bit line pair 49 (bit lines 34 and 33).

In the memory cell array 100 of the constitution mentioned above, the memory cells 10 disposed in the even row 112 have a positional deviation of approximately half the cell length in the same direction respectively from the memory cells 10 in the odd row 111. Consequently, the memory cells mutually adjacent in the direction of the row or the column need not be arranged symmetrically with respect to the boundary therebetween. Accordingly the boundary region between the memory cells is effectively usable to eventually reduce the area of the memory cell array 100.

As described above, the present invention realizes an improved memory cell of an SRAM adapted for achieving the aforementioned object, and also an array of such memory cells.

The SRAM cell comprises a flip-flop consisting of first and second inverters, and two word transistors connected to such flip-flop, wherein the gates of the word transistors are composed of a single word line, and a gate of a driver transistor in the first inverter is positioned on one side of the word line, while a gate of a driver transistor in the second inverter is positioned on the other side of the word line.

Gate regions of the driver transistors in the first and second inverters are so formed as to partially overlap the bit-line side diffused layer regions of the word transistors.

In the memory cell array, a plurality of the above memory cells are disposed in each row, and there are provided a plurality of such rows. The memory cells in the even row are so arranged as to have a positional deviation of approximately half the cell length in the same direction respectively from the memory cells in the odd row.

In the SRAM cell of the structure mentioned, the gates of the word transistors are composed of a single word line so that the area of the memory cell can be reduced. Furthermore, due to the partial overlap of the gate regions of the driver transistors with the bit-line side diffused layer regions of the word transistors, it becomes possible to attain an enhanced reduction of the memory cell area.

In the memory cell array of the above constitution, as described, the memory cells disposed in the even row have a positional deviation of approximately half the cell length in the same direction respectively from the memory cells in the odd-row. Consequently, the memory cells mutually adjacent in the direction of the row or the column need not be arranged symmetrically with respect to the boundary therebetween. Accordingly the boundary region between the memory cells is effectively usable to eventually reduce the area of the memory cell array.

Hereinafter the SRAM cell array shown in FIG. 9 will be described in further detail with reference to a specific circuit configuration thereof.

In embodying the memory cell array of FIG. 9 in the form of a specific circuit, the required bit lines are numerically greater by one than those in the conventional array, and the number of the bit-line pairs is rendered substantially twice the known value since, with the exception of the bit lines at both ends of the memory cell array 100, each bit line functions as one of the paired bit lines for the memory cells in the odd row and also as one of the paired bit lines for the memory cells in the even row. It is therefore impossible to directly employ the conventional bit-line pair selecting circuit where, as shown in the block diagram of FIG. 2, $2^n$ output signals are produced from n column address input signals $Y1-Yn$ by means of a column decoder 6, and the output signals thus obtained are used as bit-line pair selecting signals $C1-C2^n$ to select merely one of the $2^n$ bit-line pairs.

Consequently the circuit configuration needs to be modified with an adequate contrivance.

The bit-line pair selecting circuit of the present invention has improvements adapted for use in the memory cell array where the SRAM cells in the odd row and those in the even row are so arranged as to have a positional deviation of approximately half the cell length in the direction parallel with the word line, and except the bit lines at both ends of the memory cell array, each bit line serves as one of the paired bit lines for the memory cells in the odd row and also as one of the paired bit lines for the memory cells in the even row. Such bit-line pair selecting circuit comprises individual column switches connected respectively to the bit lines at both ends of the array, pairs of parallel column switches connected respectively to the bit lines except those at the ends, a column decoder for producing a bit-line pair selecting signal on the basis of a column address inputted thereto, and an AND gate circuit group for outputting a logical product of the bit-line pair selecting signal, the LSB (least significant bit) signal of a row address, and an inverted signal thereof. In this circuit configuration, the switching actions of the individual column switches and the mates of the column switch pairs are controlled by the output signals of the AND gate circuit group.

Another modified bit-line pair selecting circuit of the present invention for use in the memory cell array of the above constitution comprises column switches connected respectively to the bit lines, a column decoder for producing a bit-line pair selecting signal on the basis of the column address signal inputted thereto, an AND gate circuit group for outputting a logical product of the bit-line pair selecting signal, the LSB signal of a low address, and an inverted signal thereof, and an OR gate circuit group for outputting a logical sum of the mutually adjacent ones of the output signals from such AND gate circuit group. In this circuit configuration, the column switches connected to the bit lines at both ends are controlled by the LSB and MSB signals of the outputs from the AND gate circuit group, and the column switches connected to the other bit lines are controlled by the output signals from the OR gate circuit group.

A further modified bit-line pair selecting circuit of the present invention includes an OR gate circuit group which outputs a logical sum of each pair of the mutually adjacent bit signals with the exception of the LSB and MSB signals in the output of an AND gate circuit group, wherein column switches connected respectively to the end bit lines are controlled by the LSB and MSB signals, while column switches connected to the even bit lines are controlled by the bit-line pair selecting signals, and column switches connected to the odd bit lines are controlled by the output signals of the OR gate circuit group.

Individual column switches are connected respectively to the bit lines at both ends of the memory cell array, while column switch pairs are connected respectively to the other bit lines or a single column switch is connected to each bit line. In such circuit configuration, a signal for controlling the switching action of the column switches is obtained with respect to any one bit-line pair by executing a logical operation relative to the bit-line pair selecting signal, the LSB signal of a row address and an inverted signal thereof, so that proper selection can be performed with regard to each bit-line pair in the memory cell array where, with the exception of the bit lines at both ends, each bit line functions as one of the paired bit lines for the memory cells in the odd row and also as one of the paired bit lines for the memory cells in the even row.

Hereinafter further preferred embodiments of the present invention will be described in detail with reference to the accompanying drawings.

Figure 10:
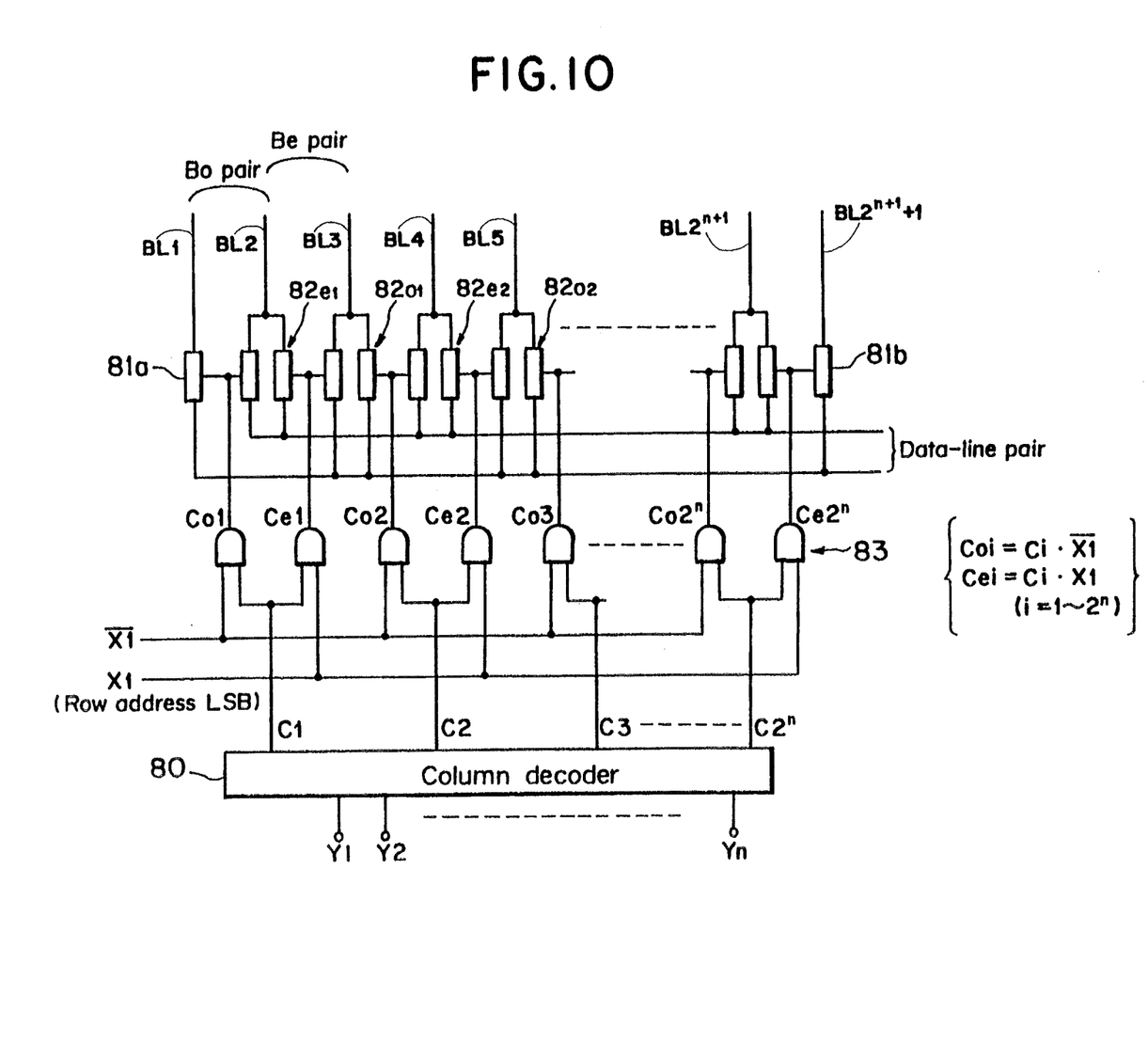
FIG. 10 is a block diagram of a fourth embodiment representing a bit-line pair selecting circuit of the present invention.

FIG. 10 is a block diagram of a fourth embodiment representing the bit-line pair selecting circuit of the present invention. In an SRAM cell array where the circuit of the invention is employed, memory cells are arranged in such a manner that the cells disposed in the odd rows and those in even rows respectively have a positional deviation of approximately half the cell length in the direction parallel with word lines and, with the exception of the bit lines at both ends of the array, each bit line serves as one of the paired bit lines for the odd-row memory cells and also as one of the paired bit lines for the even-row memory cells.

In FIG. 10, n column addresses Y1—Yn are converted into $2^n$ bit-line pair selecting signals $C1-C2^n$ by means of a column decoder 80, and $(2^{+1}+1)$ bit lines $BL1-BL2^{n+1}+1$ are provided in the memory cell array. Out of such bit lines, each pair of one odd-column bit line and one even-column bit line is termed a Bo pair for the memory cells in the odd row (memory cells connected to the word line Wo in the odd row), and each pair of one even-column bit line and one odd-column bit line is termed a Be pair for the memory cells in the even row (memory cells connected to the word line We in the even row).

Individual column switches 81a, 81b are connected respectively between the end bit lines BL1, $BL2^{n+1}+1$ and one of paired data lines. Parallel-connected column switch pairs 82e1, 82e2, .... are connected respectively between the odd-column bit lines BL2, BL4, .... except the end bit lines BL1, $BL2^{n+1}+1$ and one of the paired data lines. Furthermore, parallel-connected column switch pairs 82o1, 82o2, .... are connected respectively between the even-column bit lines BL3, BL5, .... and the other of the paired data lines.

For the purpose of controlling the switching actions of the individual column switches 81a, 81b connected respectively to the end bit lines BL1 $BL2^{n+1}+1$ and also the switching actions of the parallel-connected column switches 82e1, 82e2, ... and 82o1, 82o2, .... connected to the bit lines except the end ones, there is provided an AND gate circuit group 83 which outputs logical products of the bit-line pair selecting signals $C1-C2^n$ obtained from the column decoder 80, the LSB signal of a row address, and an inverted signal thereof.

The AND gate circuit group 83 consists of an aggregate of $2^{n+1}$ AND gate circuits for the bit-line pair selecting signals $C1-C2^n$. In such AND gate circuit group 83, the output signals Co1, Co3, .... obtained respectively from the odd AND gate circuits are used as control signals for selection of the Bo pairs, and the output signals Co2, Co4, .... obtained respectively from the even AND gate circuits are used as control signals for selection of the Be pairs.

As mentioned above, the individual column switches 81a, 81b are connected respectively to the bit lines at both ends of the memory cell array, and the parallel-connected column switch pairs 82e1, 82e2, .... and 82o1, 82o2, .... for the Bo pairs and the Be pairs are connected respectively to the other bit lines. Meanwhile the logical products of the bit-line pair selecting signals $C1-C2^n$, the row-address LSB signal and the inverted signal thereof are obtained as output signals, which are then used as control signals for selecting the Bo or Be pairs, whereby it is rendered possible to perform proper selection of each bit-line pair also in the memory cell array of FIG. 9.

Figure 11:
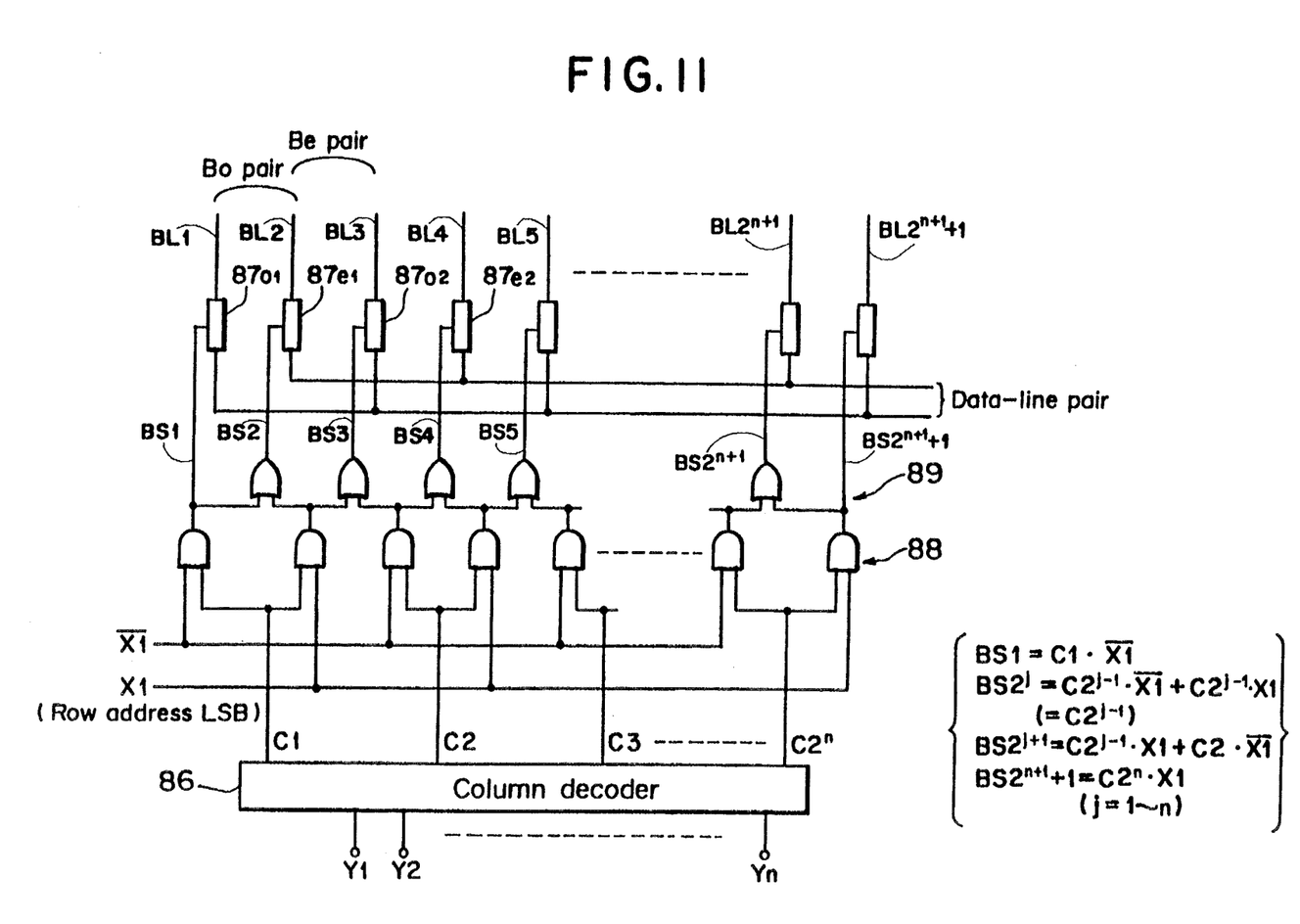
FIG. 11 is a block diagram of a fifth embodiment representing the bit-line pair selecting circuit of the invention.

FIG. 11 is a block diagram of a fifth embodiment representing the bit-line pair selecting circuit of the present invention. In this embodiment, column switches 87o1, 87o2, .... are connected respectively between one of paired data lines and the odd-column bit lines BL1, BL3, .... out of $(2^{n+1}+1)$ bit lines BL1 to $BL^{b+1}+1$ in the memory cell array; and column switches 87e1, 87e2, .... are connected respectively between the even-column bit lines BL2, BL4, ... and the other of the paired data lines.

There is provided an AND gate circuit group 88 which outputs logical products of bit-line pair selecting signals $C1-C2^n$ obtained from a column decoder 86, a row-address LSB signal and an inverted signal thereof. The AND gate circuit group 88 consists of, similarly to the one in the aforementioned embodiment, an aggregate of $2^{n+1}$ AND gate circuits in conformity with the bit-line pair selecting signals $C1-C2^n$. There is further provided an OR gate circuit group 89 which outputs logical sums of the mutually adjacent bit signals out of the entire signals obtained from the AND gate circuit group 88.

The LSB signal BS1 and the MSB signal $BS2^{n+1}+1$ of the output signals from the AND gate circuit group 88 are used for controlling the switching actions of the column switches connected respectively to the end bit lines BL1, $BL2^{n+1}+1$; while the output signals $BS2-BS2^{n+1}+1$ obtained from the OR gate circuit group 89 are used for controlling the switching actions of the column switches connected respectively to the other bit lines $BL2-BL2^{n+1}$.

Thus, as described, a single column switch is connected to each bit line, and the actions of the column switches relevant to any one pair of mutually adjacent two bit lines are controlled by the bit-line pair selecting signals $BS1-BS2^{n+1}+1$ which are obtained through the logical operation relative to the bit-line pair selecting signals $C1-C2^n$, the row-address LSB signal and the inverted signal thereof, whereby it is rendered possible to achieve proper selection of each bit-line pair as in the aforementioned case of the fourth embodiment.

Figure 12:
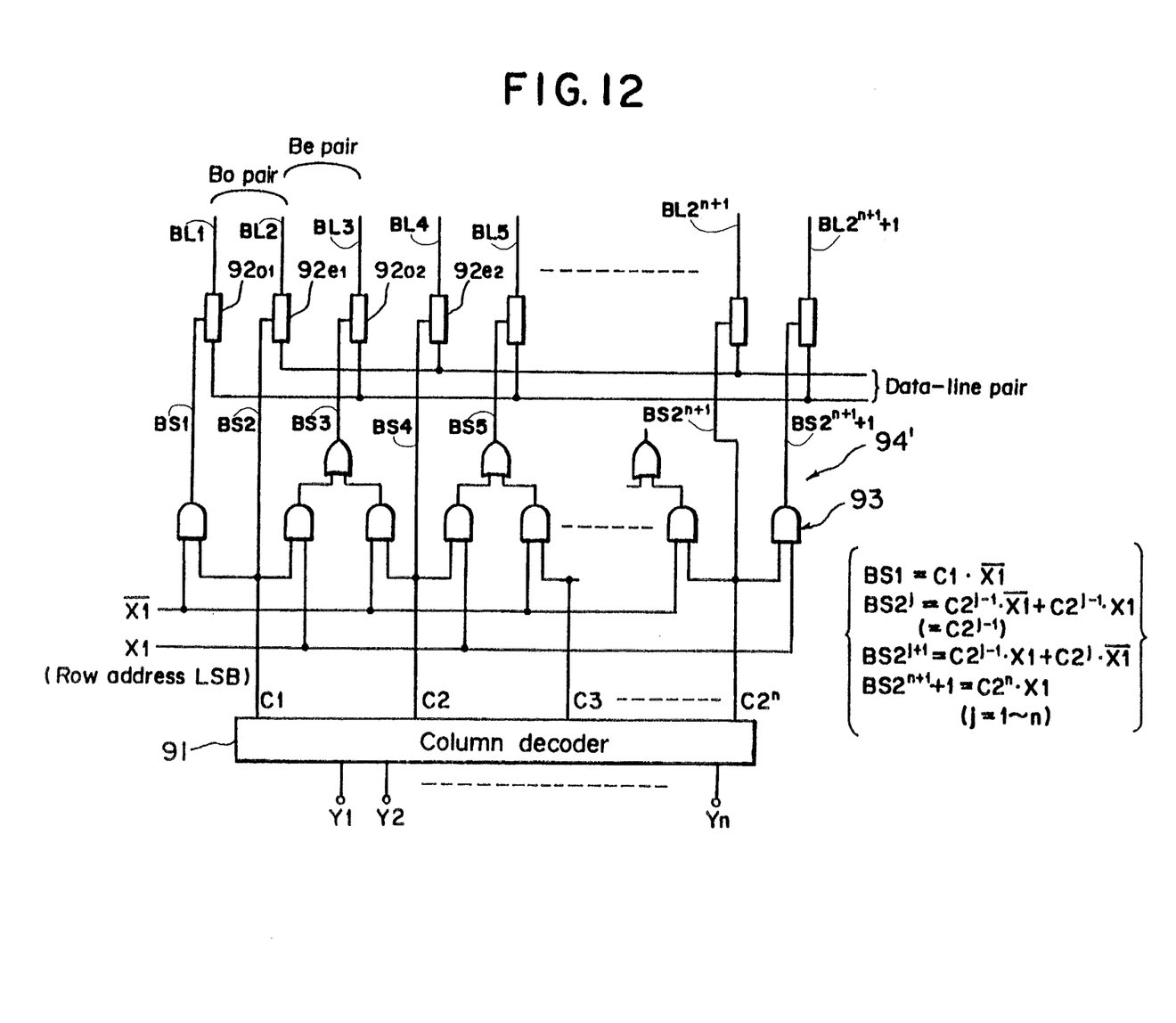
FIG. 12 is a block diagram of a sixth embodiment representing the bit-line pair selecting circuit of the invention.

FIG. 12 is a block diagram of a sixth embodiment representing a modification of the bit-line pair selecting circuit. In this embodiment, an OR gate circuit group 94' outputs a logical sum of each pair of mutually adjacent bit signals with the exception of the LSB signal BS1 and the MSB signal $BS2^{n+1}+1$ included in the output signals of an AND gate circuit group 93, and column switches connected respectively to the bit lines BL1, $BL^{n+1}+1$ at both ends of the memory cell array are controlled by the LSB signal BS1 and the MSB signal $BS2^{n+1}+1$. Meanwhile, column switches connected to the even bit lines BS2, BS4, .... are controlled by the bit-line pair selecting signals $C1-C2^n$, and column switches connected to the odd bit lines BS3, BS5, .... are controlled by the output signals BS3, BS5, .... obtained from the OR gate circuit group.

Due to such circuit configuration, the achievable circuit operation is fundamentally the same as that of the foregoing fifth embodiment, so that it becomes possible to attain proper selection of each bit-line pair. And in comparison with the fifth embodiment, $2^n$ OR gate circuits can be curtailed correspondingly to the bit-line pair selecting signals $C1-C2^n$, hence realizing enhanced simplification of the circuit configuration.

Although each of the above embodiment employs a circuit configuration based on positive logic, it is a matter of course that negative logic may also be adopted in compliance with requirements.

According to the present invention, as described hereinabove, individual column switches are connected to the bit lines at both ends of the memory cell array, and column switch pairs are connected respectively to the other bit lines, or a single column switch is connected to each of the bit lines, and control signals for controlling the switching actions of the column switches relevant to any one bit-line pair are obtained by logical operation relative to bit-line pair selecting signals, a row-address LSB signal and an inverted signal thereof. Consequently, it becomes possible to perform proper selection of each bit-line pair in the memory cell array where, with the exception of the bit lines at both ends, each line functions as one of the paired bit lines for the odd-row memory cells and also as one of the paired bit lines for the even-row memory cells.

Although other modifications and changes may be suggested by those skilled in the art, it is the intention of the inventor to embody within the patent warranted hereon all changes and modifications as reasonably and properly come within the scope of his contribution to the art.

What is claimed is:

1. A bit-line pair selecting circuit in a memory cell array of cells having a cell length where SRAM cells in odd rows and those in even rows are so arranged as to respectively have a positional deviation of approximately half the cell length in the direction parallel With word lines and, with the exception of the bit lines at both ends of the array, each bit line functions as one of the paired bit lines for the odd-row memory cells and also as one of the paired bit lines for the even-row memory cells, said bit-line pair selecting circuit comprising:
   individual column switches connected respectively to said bit lines at both ends;
   parallel-connected column switch pairs connected respectively to said bit lines except those at both ends;
   a column decoder for outputting bit-line pair selecting signals in accordance with input column address signals; and
   an AND gate circuit group for outputting logical products of said bit-line pair selecting signals, a row-address LSB signal and an inverted signal thereof;
   wherein the switching actions of said individual column switches and the mates of said column switch pairs are controlled by the output signals of said AND gate circuit group.

2. A bit-line pair selecting circuit in a memory cell array of cells having a cell length where SRAM cells in odd rows and those in even rows are so arranged as to respectively have a positional deviation of approximately half the cell length in the direction parallel with word lines and, with the exception of the bit lines at both ends of the array, each bit line functions as one of the paired bit lines for the odd-row memory cells and also as one of the paired bit lines for the even-row memory cells, said bit-line pair selecting circuit comprising:
   column switches connected respectively to the bit lines;
   a column decoder for outputting bit-line pair selecting signals in accordance with input column address signals;
   an AND gate circuit group for outputting logical products of the bit-line pair selecting signals, a row-address LSB signal and an inverted signal thereof; and
   an OR gate circuit group for outputting logical sums of the mutually adjacent bit signals in the output signals of said AND gate circuit group;
   wherein said column switches connected respectively to said bit lines at both ends are controlled by the LSB and MSB signals included in the output signals of said AND gate circuit group; and said column switches connected to the other bit lines are controlled by the output signals of said OR gate circuit group.

3. The bit-line pair selecting circuit according to claim 2, wherein said OR gate circuit group outputs a logical sum of each pair of the mutually adjacent bit signals except the LSB and MSB signals included in the output signals of said AND gate circuit group; and said column switches connected respectively to said bit lines at both ends are controlled by said LSB and MSB signals; and said column switches connected to the even bit lines are controlled by said bit-line pair selecting signals, whereas said column switches connected to the odd bit lines are controlled by the output signals of said OR gate circuit group.

* * * * *